United States Patent
Sano

(10) Patent No.: US 12,127,337 B2
(45) Date of Patent: Oct. 22, 2024

(54) FLEXIBLE SUBSTRATE

(71) Applicant: Japan Display Inc., Tokyo (JP)

(72) Inventor: Takumi Sano, Tokyo (JP)

(73) Assignee: Japan Display Inc., Tokyo (JP)

(*) Notice: Subject to any disclaimer, the term of this patent is extended or adjusted under 35 U.S.C. 154(b) by 286 days.

(21) Appl. No.: 17/455,932

(22) Filed: Nov. 22, 2021

(65) Prior Publication Data

US 2022/0087009 A1 Mar. 17, 2022

Related U.S. Application Data

(63) Continuation of application No. PCT/JP2020/011780, filed on Mar. 17, 2020.

(30) Foreign Application Priority Data

May 28, 2019 (JP) .................................. 2019-099646

(51) Int. Cl.
*H05K 1/02* (2006.01)
*H05K 1/18* (2006.01)

(52) U.S. Cl.
CPC ............. *H05K 1/028* (2013.01); *H05K 1/189* (2013.01)

(58) Field of Classification Search
CPC ...... H05K 1/028; H05K 1/189; H05K 1/0289; H05K 1/0283; H05K 1/0277; H05K 1/0281; H05K 1/0393; H05K 2201/0191; H05K 2201/05; H05K 2201/2009
See application file for complete search history.

(56) References Cited

U.S. PATENT DOCUMENTS

| | | | |
|---|---|---|---|
| 8,119,924 B2* | 2/2012 | Abe ................. | H01L 23/49822 174/250 |
| 10,310,560 B2* | 6/2019 | Choi ..................... | H05B 33/14 |
| 2015/0282294 A1 | 10/2015 | Wakuda et al. | |
| 2015/0282296 A1 | 10/2015 | Ogura et al. | |
| 2017/0181276 A1* | 6/2017 | Sawada .................. | B32B 27/38 |

(Continued)

FOREIGN PATENT DOCUMENTS

| | | |
|---|---|---|
| JP | 2015-198101 A | 11/2015 |
| JP | 2015-198102 A | 11/2015 |
| JP | 2016-018198 A | 2/2016 |

(Continued)

OTHER PUBLICATIONS

JP 2018-223384 Translation (Year: 2023).*

(Continued)

*Primary Examiner* — Hoa C Nguyen
*Assistant Examiner* — John B Freal
(74) *Attorney, Agent, or Firm* — Maier & Maier, PLLC

(57) ABSTRACT

According to one embodiment, a flexible substrate includes an insulating base including a first surface and a second surface on an opposite side to the first surface, a wiring layer provided on the second surface side of the insulating base and a resin layer including a support located on the first surface side of the insulating base and a coating layer located on the second surface side of the insulating base, the resin layer including a first area and a second area in planar view, the resin layer having a first elastic modulus in the first area and a second elastic modulus in the second area, and the first elastic modulus being greater than the second elastic modulus.

10 Claims, 14 Drawing Sheets

(56) References Cited

U.S. PATENT DOCUMENTS

2017/0371194 A1* 12/2017 Tomioka ............... H01L 27/124
2021/0267045 A1*  8/2021 Takada .................. H05K 1/148

FOREIGN PATENT DOCUMENTS

| JP | 2017-113088 A |   | 6/2017  |
|----|---------------|---|---------|
| JP | 2017-118109 A |   | 6/2017  |
| JP | 2017-227830 A |   | 12/2017 |
| JP | 2018-223384   | * | 11/2018 |

OTHER PUBLICATIONS

International Search Report issued Jun. 9, 2020 in PCT/JP2020/011780 filed on Mar. 17, 2020, 2 pages.

Office Action issued on Apr. 4, 2023, in corresponding Japanese Application No. 2019099646, 5 pages.

* cited by examiner

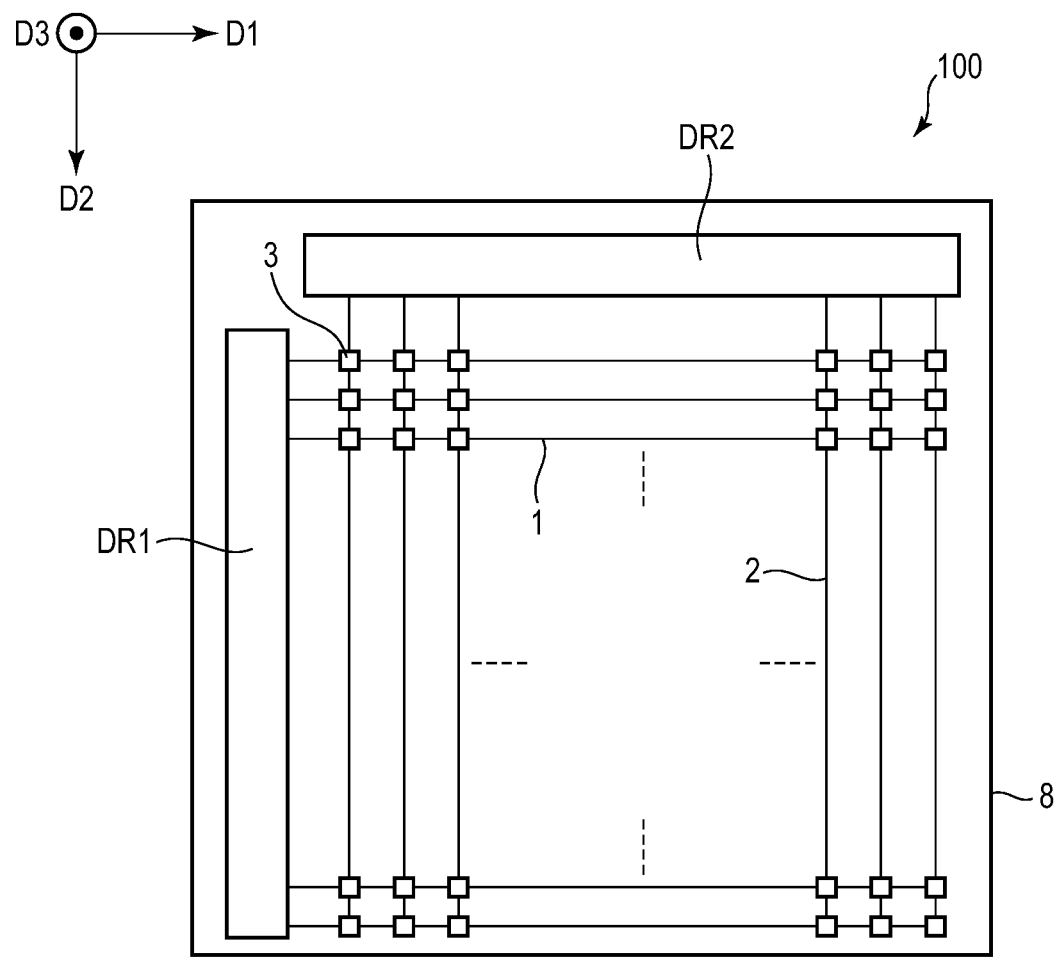
F I G. 1

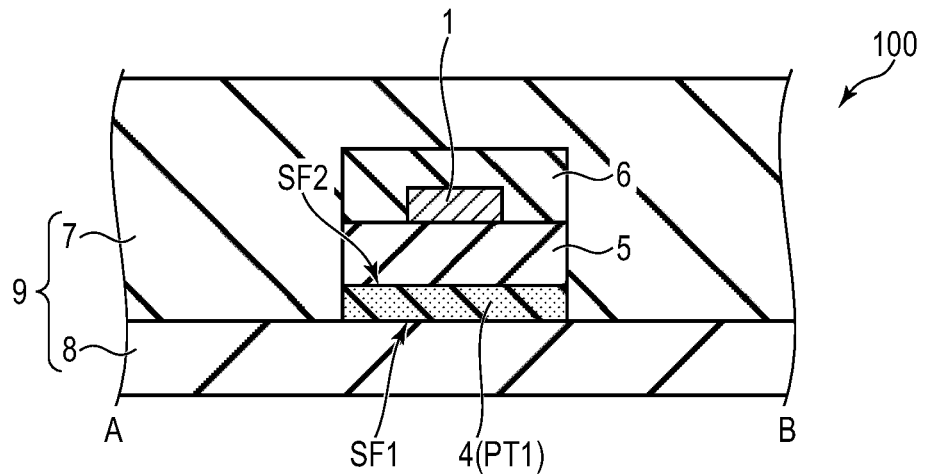
F I G. 3
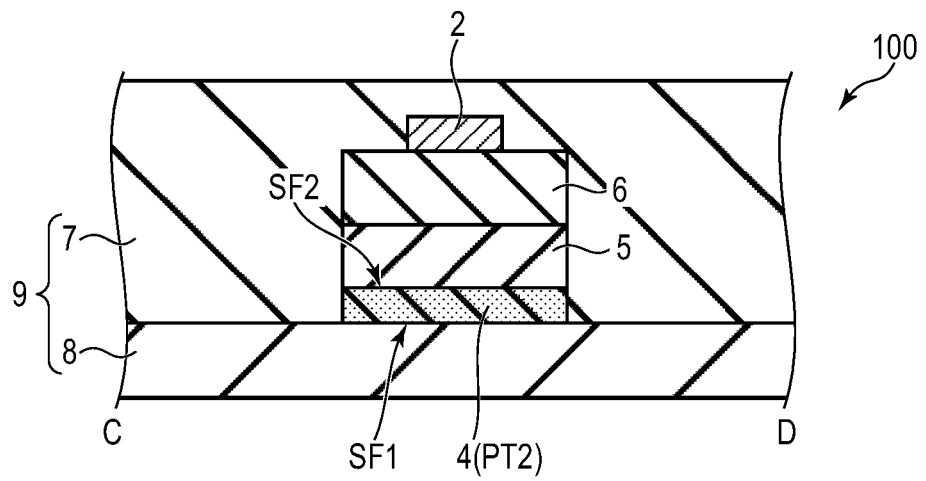
F I G. 4

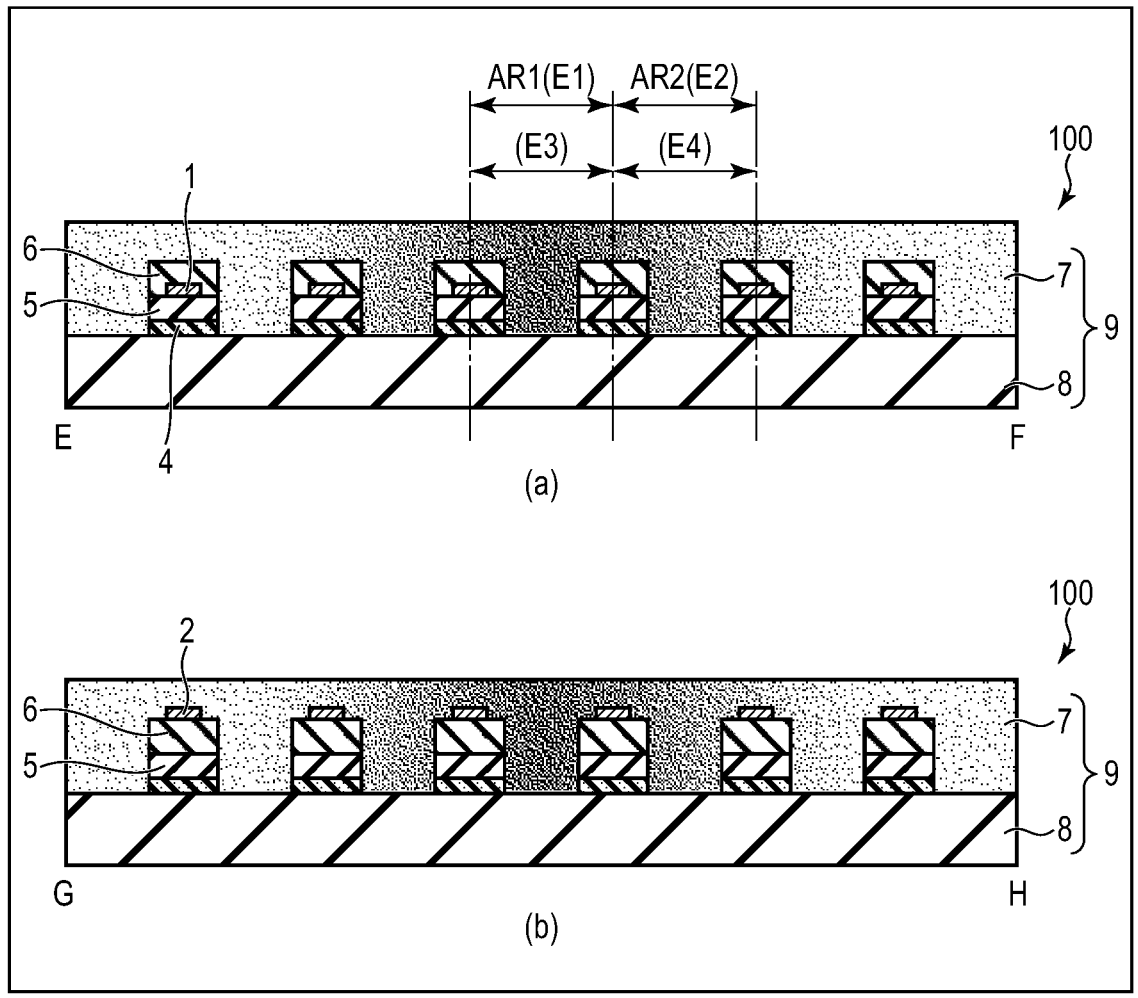
F I G. 6

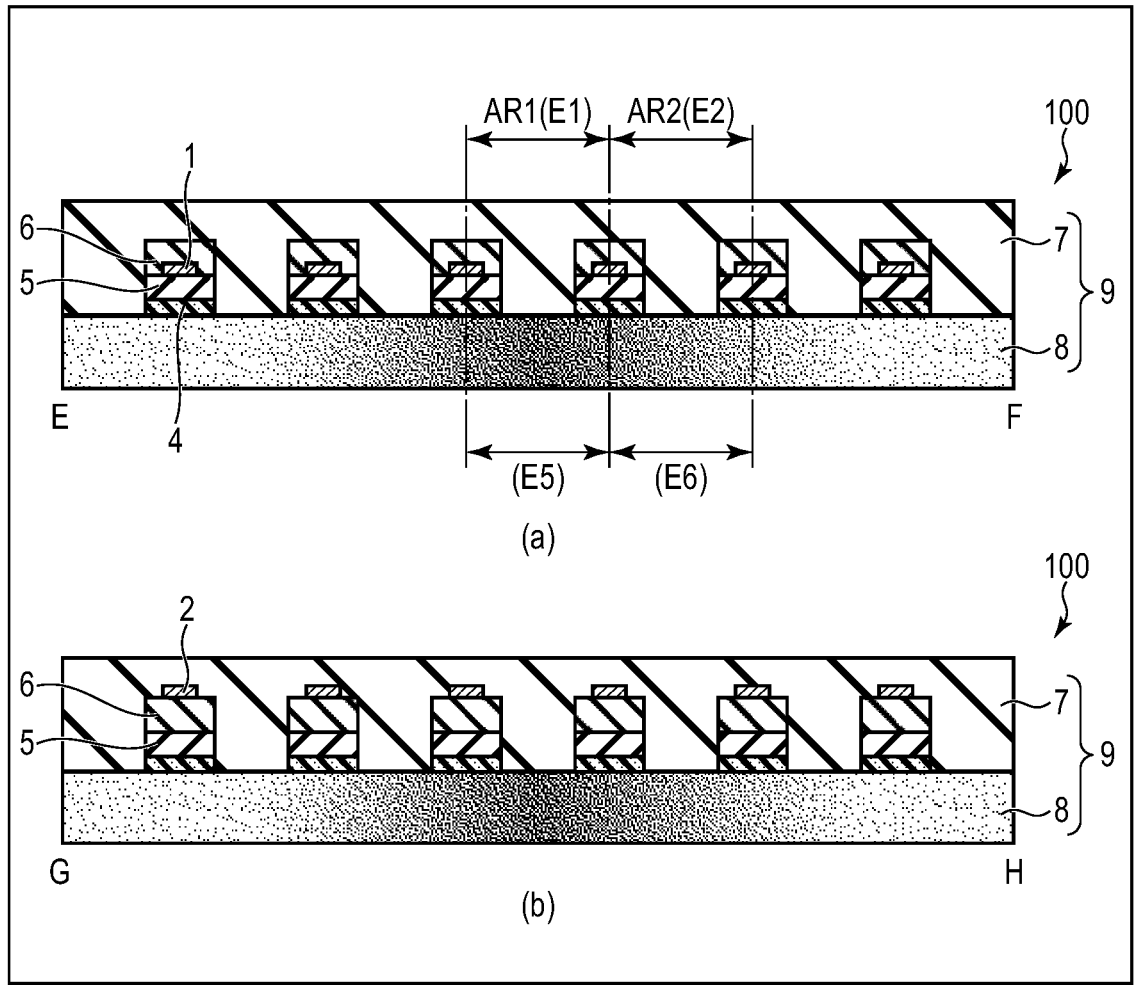
F I G. 8

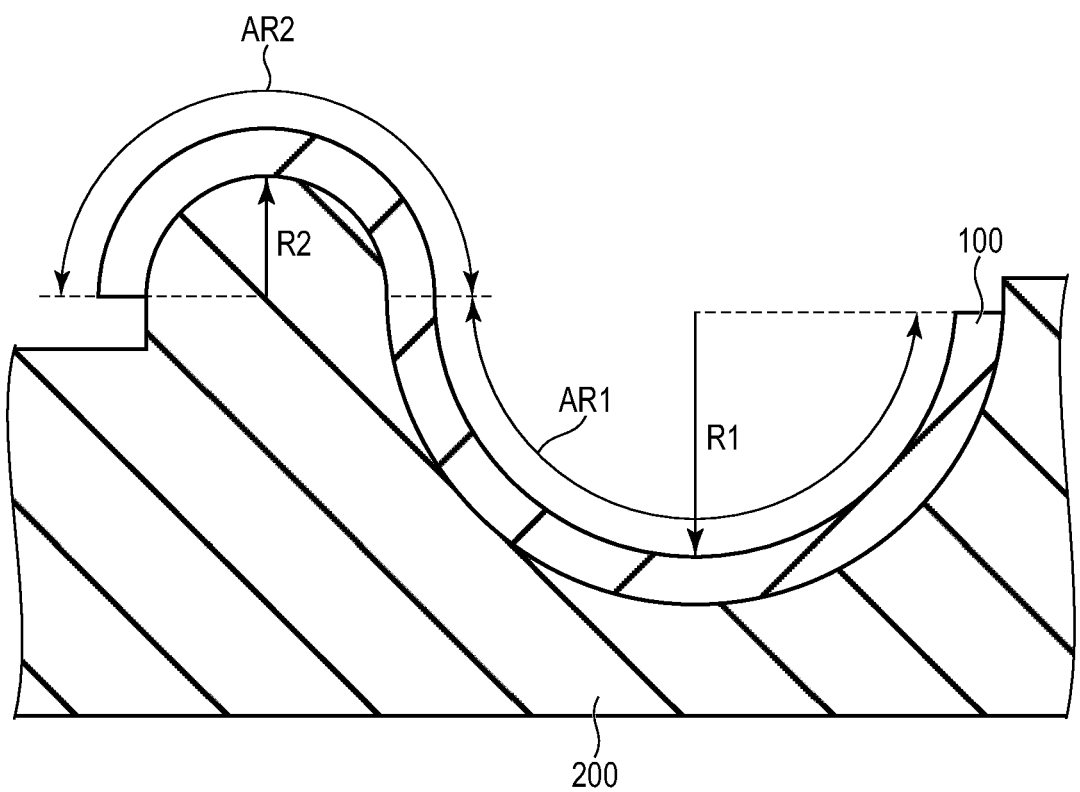
F I G. 10

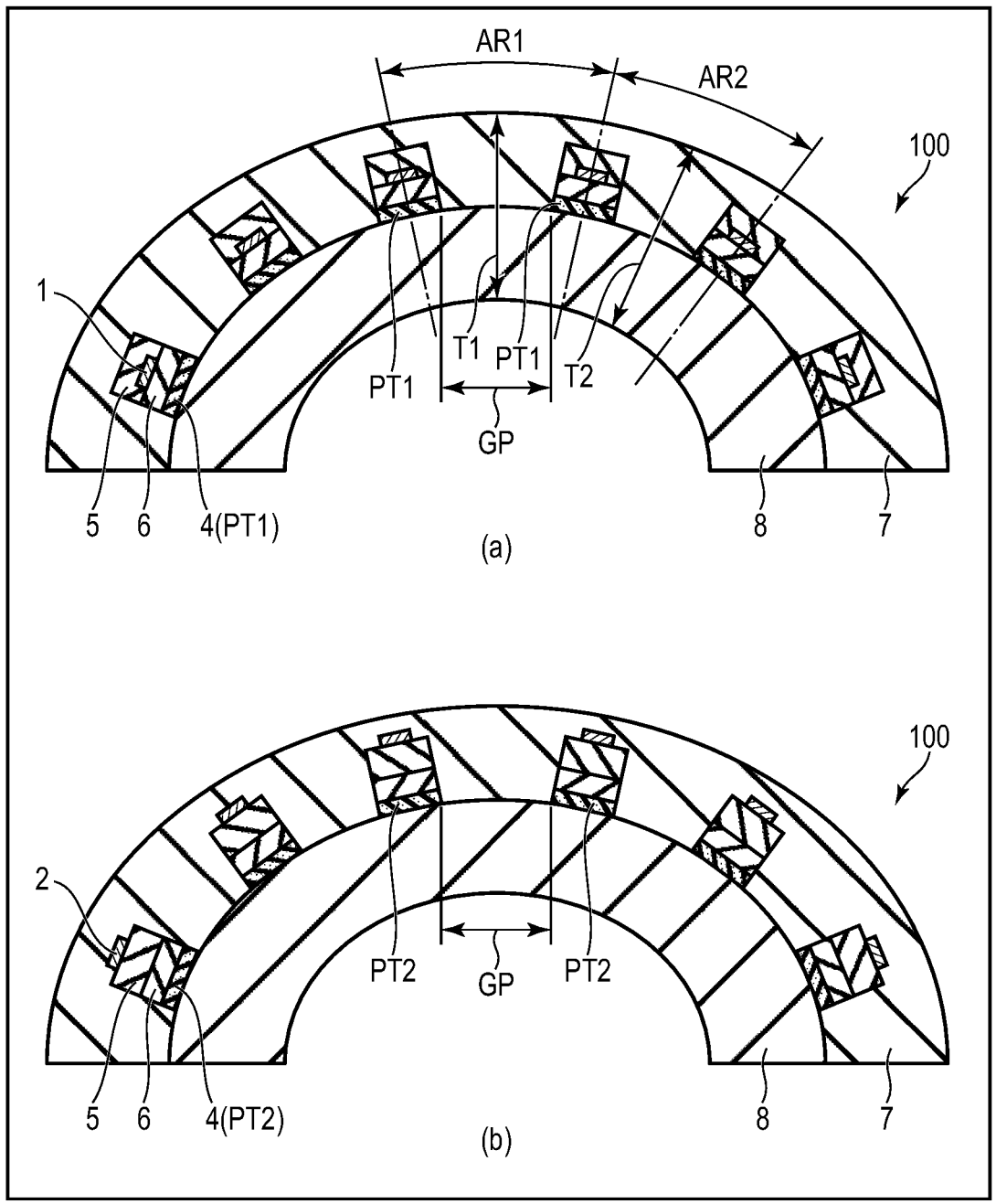
F I G. 13

FLEXIBLE SUBSTRATE

CROSS-REFERENCE TO RELATED APPLICATIONS

This application is a Continuation Application of PCT Application No. PCT/JP2020/011780, filed Mar. 17, 2020 and based upon and claiming the benefit of priority from Japanese Patent Application No. 2019-099646, filed May 28, 2019, the entire contents of all of which are incorporated herein by reference.

FIELD

Embodiments described herein relate generally to a flexible substrate.

BACKGROUND

In recent years, the use of flexible substrates having flexibility and elasticity has been studied in various fields. For example, such a use can be considered that a flexible substrate with electrical elements arranged in a matrix are attached to a curved surface such as an enclosure of an electronic device or a human body. As electrical elements, for example, various types of sensors such as touch sensors and temperature sensors, and display elements, can be applied.

BRIEF DESCRIPTION OF THE DRAWINGS

FIG. 1 is a plan view schematically showing a flexible substrate according to an embodiment.

FIG. 3 is a cross-sectional schematically showing a part of the flexible substrate, taken along line A-B in FIG. 2.

FIG. 4 is a cross-sectional schematically showing a part of the flexible substrate, taken along line C-D in FIG. 2.

FIG. 6 is a cross-sectional view schematically showing the flexible substrate illustrated in section (c) of FIG. 5.

FIG. 8 is a cross-sectional view showing the first modified example of the first embodiment.

FIG. 10 is a cross-sectional view showing a specific example of the first embodiment.

FIG. 13 is a cross-sectional view of the flexible substrate shown in FIG. 12 in a curved state.

DETAILED DESCRIPTION

Figure 2:
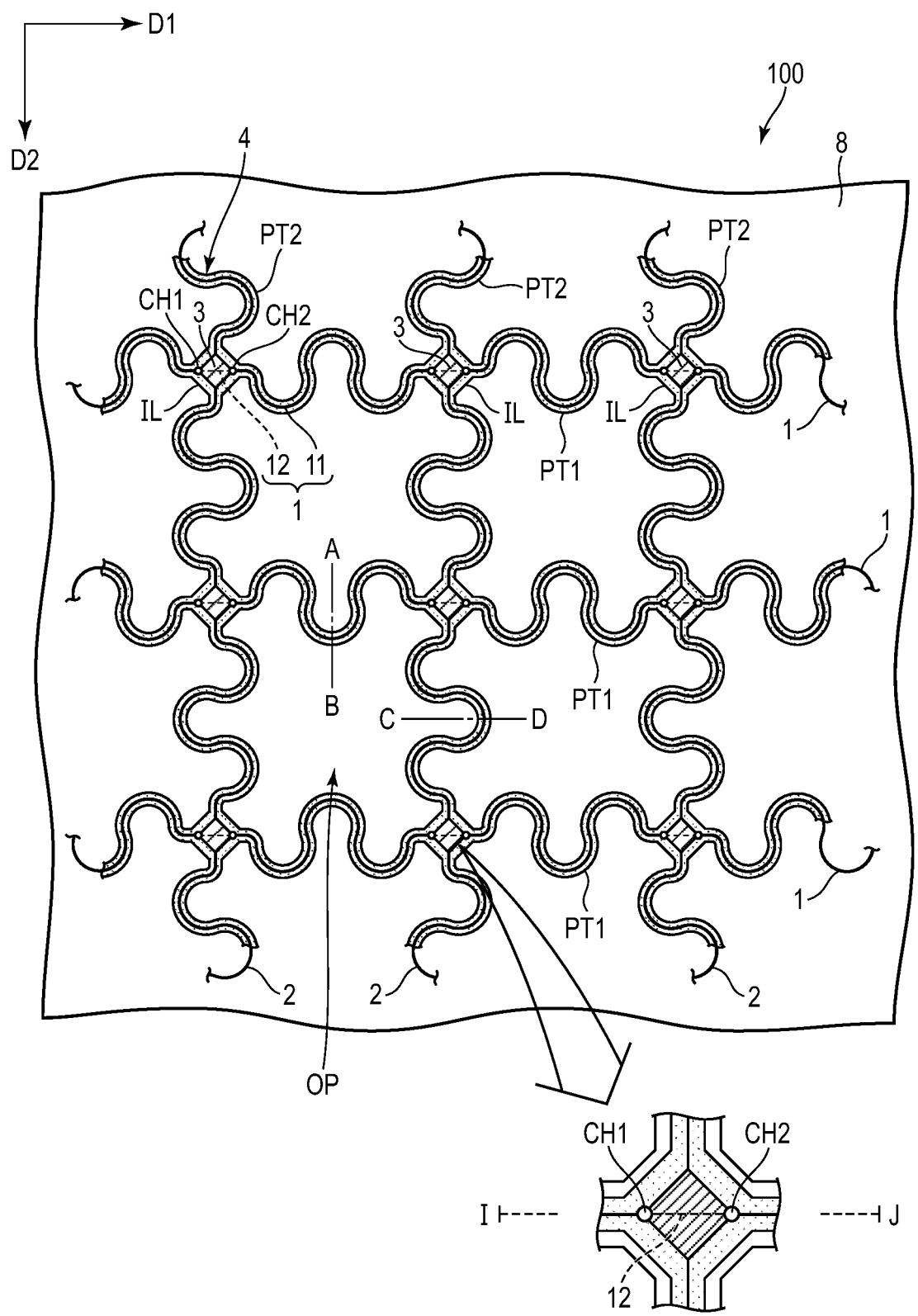
FIG. 2 is a partially enlarged plan view of the flexible substrate shown in FIG. 1.

In general, according to one embodiment, a flexible substrate comprises an insulating base comprising a first surface and a second surface on an opposite side to the first surface, a wiring layer provided on the second surface side of the insulating base and a resin layer including a support located on the first surface side of the insulating base and a coating layer located on the second surface side of the insulating base, the resin layer including a first area and a second area in planar view, the resin layer having a first elastic modulus in the first area and a second elastic modulus in the second area, and the first elastic modulus being greater than the second elastic modulus.

According to another embodiment, a flexible substrate comprises an insulating base comprising a first surface and a second surface on an opposite side to the first surface, a wiring layer provided on the second surface side of the insulating base and a resin layer including a support located on the first surface side of the insulating base and a coating layer located on the second surface side of the insulating base, the resin layer including a first area and a second area in planar view, the resin layer having a first film thickness in the first area and a second film thickness in the second area in a cross-sectional view, the first film thickness being greater than the second film thickness when the first area and the second area have no curvature, and the first film thickness being equal to the second film thickness when the first area and the second area have curvature.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a plan view schematically showing a flexible substrate 100 according to an embodiment.

In this embodiment, a first direction D1, a second direction D2 and a third direction D3 are defined as shown in the figure. The first direction D1 and the second direction D2 are parallel to the main surface of the flexible substrate 100 and they intersect each other. The third direction D3 is perpendicular to the first direction D1 and the second direction D2, and is equivalent to a thickness direction of the flexible substrate 100. The first direction D1 and the second direction D2 intersect perpendicular to each other in this embodiment, but they may intersect at angles other than perpendicular.

The flexible substrate 100 comprises a plurality of scanning lines 1, a plurality of signal lines 2, a plurality of electrical elements 3, a support 8, a scanning line driver DR1 and a signal line driver DR2. The scanning lines 1, the signal lines 2, the electrical elements 3, the scanning line driver DR1 and the signal line driver DR2 are located on the support 8. The scanning lines 1 each extend along the first direction D1 and are aligned along the second direction D2. The scanning lines 1 are each connected to the scanning line driver DR1. The signal lines 2 each extend along the second direction D2 and are aligned along the first direction D1. The signal lines 2 are each connected to the signal line driver DR2. The electrical elements 3 are each located at an intersection of a scanning line 1 and a respective signal line 2 and are electrically connected to the scanning line 1 and the signal line 2. Note that the details of the functions of the electrical elements 3 will be described later.

FIG. 2 is a partially enlarged plan view of the flexible substrate 100 shown in FIG. 1.

In addition to the above, the flexible substrate 100 comprises an insulating base 4 that supports the scanning lines 1 and the signal lines 2.

The insulating base 4 includes, in plan view, a plurality of first portions PT1 extending along the first direction D1 and aligned along the second direction D2, a plurality of second portions PT2 extending along the second direction D2 and aligned along the first direction D1, and a plurality of island-shaped portions IL provided respectively at intersections of the first portions PT1 and the second portions PT2. The first portion PT1 and the second portion PT2 are each formed in a wavy shape. The island-shaped portions IL are connected to the first portions PT1 and the second portions PT2, respectively. The insulating base 4 has elasticity and flexibility, and can be formed of polyimide, for example, but it is not limited to this example. The insulating base 4 forms openings OP each surrounded by two adjacent first portions PT1 and two respective adjacent second portions PT2. The openings OP are arranged in a matrix along the first direction D1 and the second direction D2.

The scanning lines 1 are each located on the respective first portions PT1 and are arranged into a wavy pattern. The signal lines 2 are each located on the respective second portions PT2 and are arranged into a wavy pattern. The scanning lines 1 and the signal lines 2 are examples of the wiring lines of the flexible substrate 100. The scanning lines 1 and the signal lines 2 can be formed, for example, of a metal material or a transparent conductive material, and may be of a single- or a multi-layered structure. The flexible substrate 100 may comprise other types of wiring lines, such as power supply lines that supplies power to the electrical elements 3, in addition to the scanning lines 1 and the signal lines 2.

The scanning lines 1 each include a first portion 11 indicated by a solid line, and a second portion 12 indicated by a dashed line. The second portion 12 overlaps the respective electrical element 3. The first portion 11 and the second portion 12 are located in different layers from each other and are electrically connected to each other via contact holes CH1 and CH2.

The scanning lines 1 supply scanning signals to the electrical elements 3. When, for example, the electrical element 3 is of a type that outputs signals, such as a sensor, the signal line 2 supplies the output signal from the electrical element 3. Further, when, for example, the electrical element 3 is one that operates in response to an input signal, such as a light-emitting element or an actuator, a drive signal is supplied to the signal line 2. The controller, which includes a supply source of scanning signals, a supply source of drive signals, or a processor that processes output signals, may be provided in the flexible substrate 100 or in a device connected to the flexible substrate 100.

The electrical element 3 is located on the respective island-shaped portion IL. The electrical element 3 is smaller than the island-shaped portion IL, and in FIG. 2, the island-shaped portion IL protrudes from an edge of the electrical element 3. For example, the electrical element 3 is a sensor, a semiconductor device or an actuator. For example, as the sensor, an optical sensor that receives visible light or near-infrared light, a temperature sensor, a pressure sensor or a touch sensor can be applied. For example, as the semiconductor element, a light-emitting element, a light-receiving element, a diode or a transistor can be applied. When the electrical element 3 is a light-emitting element, a flexible display having flexibility and elasticity can be realized. As the light-emitting element, for example, a light-emitting diode with a size of around 100 µm, such as a mini-LED or micro-LED, or an organic electroluminescent element can be applied. When the electrical element 3 is an actuator, for example, a piezoelectric element can be applied. Note that the electrical element 3 is not limited to those examples illustrated here, but other elements with various functions can be applied as well. The electrical element 3 may be a capacitor, a resistor or the like. The position and shape of the electrical element 3 are not limited to those of the example shown in FIG. 2.

FIG. 3 is a cross-sectional view schematically showing a part of the flexible substrate 100, indicated by line A-B in FIG. 2.

The flexible substrate 100 further comprises a first organic insulating layer 5, a second organic insulating layer 6 and a resin layer 9, in addition to the elements described above. The insulating base 4 includes a first surface SF1 and a second surface SF2 on an opposite side to the first surface SF1. The first organic insulating layer 5 covers the second surface SF2. The scanning line 1 is provided on a second surface SF2 side of the insulating base 4. Specifically, the scanning line 1 is disposed on the first organic insulating layer 5. The second organic insulating layer 6 covers the scanning line 1 and the first organic insulating layer 5. The first organic insulating layer 5 and the second organic insulating layer 6 are formed of an organic material such as polyimide. The first organic insulating layer 5 and the second organic insulating layer 6 may as well be provided in where there is no insulating base 4. However, from the viewpoint of the flexibility and elasticity of the flexible substrate 100, such an arrangement as shown in FIG. 3 is preferable. Further, in the example shown in FIG. 3, the signal line 2 is not placed directly above the first portion PT1.

The resin layer 9 includes a support 8 located on a first surface SF1 side of the insulating base 4 and a coating layer 7 located on a second surface SF2 side of the insulating base 4. In the example illustrated in the figure, the support 8 is in contact with the first surface SF1. The support 8 is formed of an organic material having flexibility. The coating layer 7 covers the insulating base 4, the first organic insulating layer 5 and the second organic insulating layer 6. The coating layer 7 is formed of a flexible organic material having a poly-p-xylene structure, such as Parylene (registered trademark). In the area where there is no insulating base 4, the coating layer 7 and the support 8 are in contact with each other. The support 8 may be formed by applying an organic material on to lower surfaces of the insulating base 4 and the coating layer 7, or it may be formed in the form of a film or plate and attached via an adhesive layer.

FIG. 4 is a cross-sectional view schematically showing a part of the flexible substrate 100, indicated by line C-D in FIG. 2.

The signal line 2 is provided on a second surface SF2 side of the insulating base 4. More specifically, the signal line 2 is disposed on the second organic insulating layer 6. The coating layer 7 covers the signal lines 2, the insulating base 4, the first organic insulating layer 5 and the second organic insulating layer 6. In the example shown in FIG. 4, the scanning line 1 is not placed directly above the second portion PT2. As shown in FIGS. 3 and 4, the insulating base 4, the first organic insulating layer 5, the second organic insulating layer 6, the scanning line 1 and the signal line 2 are surrounded by the resin layer 9 from above, below, left and right.

Figure 5:
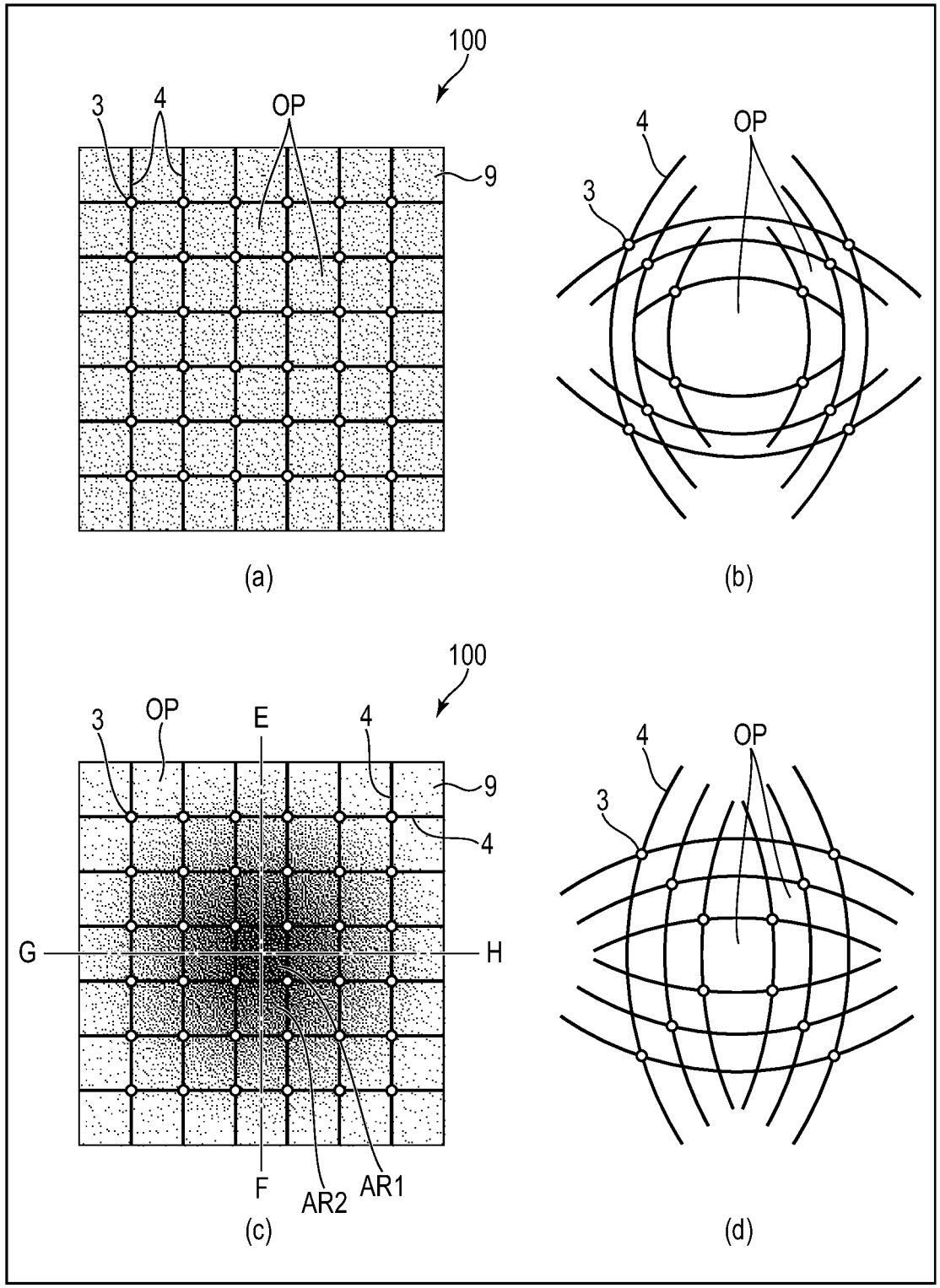
FIG. 5 is a plan view schematically showing the flexible substrate of this embodiment and a flexible substrate of a comparative example.

FIG. 5 is a plan view schematically showing the flexible substrate 100 of this embodiment and a comparative example thereof. FIG. 5 shows in part (a) the flexible substrate 100 of the comparative example. FIG. 5 shows in part (b) an arrangement form of the insulating base 4 when the flexible substrate 100 shown in FIG. 5, part (a) is expanded. FIG. 5 shows in part (c) the flexible substrate 100 of this embodiment. FIG. 5 shows in part (d) an arrangement form of the insulating base 4 when the flexible substrate 100 shown in FIG. 5, part (c) is expanded. Note that in this specification, the shading of dots indicates the degree of the modulus of elasticity, where the higher the density of the dots, the higher the modulus of elasticity, and the lower the density of the dots, the lower the modulus of elasticity.

In the flexible substrate 100 shown in FIG. 5, part (a), the elastic modulus of the resin layer 9 is uniform regardless of the location of the area. Further, the openings OP are substantially equal to each other in size. The flexible substrate 100 is affixed to a curved surface of, for example, an electronic device or object. When the flexible substrate 100 is attached to a surface with non-uniform curvature, as shown in FIG. 5, part (b), the elongation rate of the insulating base 4 differs from one area to another, and the sizes of the openings OP vary. As a result, the arrangement density of the electrical elements 3 varies, which may cause uneven optical characteristics and amount of light reception depending on the area.

In the flexible substrate 100 shown in FIG. 5, part (c), the elastic modulus of the resin layer 9 differs from one area to another. In the example illustrated in the figure, the elastic modulus lowers as the location is further from the center outwards in the flexible substrate 100. Here, the sizes of the openings OP are substantially equal to each other. When the flexible substrate 100 is affixed to a surface with non-uniform curvature, as shown in FIG. 5, part (d), the sizes of the openings OP are made more even as compared to the case of the comparative example shown in FIG. 5, part (b). In other words, the elongation rate of the flexible substrate 100 can be adjusted by adjusting the elastic modulus of the resin layer 9 according to the curvature of the surface of the object on which the layer is attached. Thus, the variation in size of the openings OP can be reduced. The expansion of the openings OP in size can be suppressed by increasing the elastic modulus as the curvature is smaller.

The elastic modulus of the resin layer 9 may be adjusted by adjusting the elastic modulus of either one of the coating layer 7 and the support 8, or by adjusting the elastic moduli of both. The modulus of elasticity of the resin layer 9 is adjusted without changing the thickness of the resin layer 9. For example, it is adjusted by changing the curing time of UV curing depending on the area. As the curvature is larger, the UV irradiation time should be shortened to lower the elastic modulus. The elastic modulus of the resin layer 9 may as well be adjusted by using different resin materials for different areas. In this case, as the curvature is larger, a resin with a lower elastic modulus is used.

According to this embodiment, the resin layer 9 has different elastic moduli in different areas according to the curvature of the surface of the object on which the layer is attached. With this structure, the variation of the openings OP in size can be reduced. Thus, variations in the arrangement density of the electrical elements 3 can be reduced, thereby making it possible to suppress unevenness in optical characteristics and light-receiving amount, which may occur depending on the area.

FIG. 6 is a cross-sectional view schematically showing the flexible substrate 100 shown in FIG. 5, part (c). FIG. 6, part (a), is a schematic cross-sectional view of the flexible substrate 100, indicated by line E-F in FIG. 5, part (c). FIG. 6, part (b) is a schematic cross-sectional view of the flexible substrate 100, indicated by line G-H in FIG. 5, part (c). The configuration shown in FIG. 6 illustrates the case where the elastic modulus of the coating layer 7 is adjusted in the resin layer 9. In FIG. 6, the elastic modulus of the support 8 is uniform.

As shown in FIG. 6, parts (a) and (b), the elastic modulus of the coating layer 7 decreases as the location is further from the center outwards. Here, in the resin layer 9, a first area AR1 and a second area AR2, which is different from the first area AR1, are defined. As shown in FIG. 5, part (c), the resin layer 9 includes the first area AR1 and the second area AR2 in planar view. The resin layer 9 has a first elastic modulus E1 in the first area AR1 and a second elastic modulus E2 in the second area AR2. The first elastic modulus E1 is greater than the second elastic modulus E2. The coating layer 7 has a third elastic modulus E3 in the first area AR1 and a fourth elastic modulus E4 in the second area AR2. The third elastic modulus E4 is greater than the fourth elastic modulus E4. The support 8 has an equal modulus of elasticity in the first and second areas AR1 and AR2.

Figure 7:
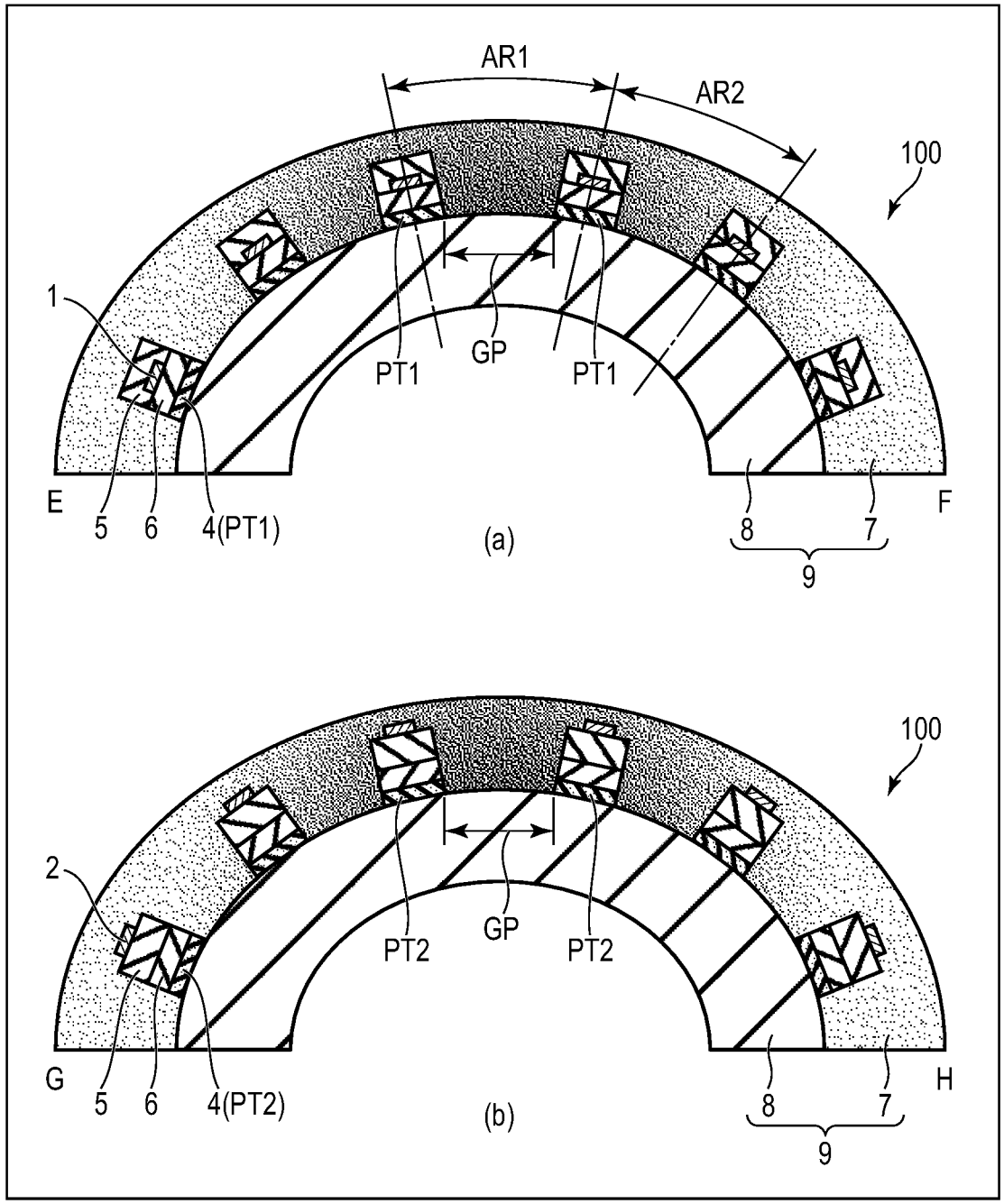
FIG. 7 is a cross-sectional view of the flexible substrate shown in FIG. 6 in a curved state.

FIG. 7 is a cross-sectional view of the flexible substrate 100 shown in FIG. 6 in a curved state. The flexible substrate 100 shown in FIG. 7, part (a) has the curvature which increases as the location is further from the center outwards. The larger the curvature of the flexible substrate 100, the smaller the elastic modulus of the coating layer 7. In other words, the larger the curvature of the flexible substrate 100, the smaller the elastic modulus of the resin layer 9. The curvature of the first area AR1 is less than the curvature of the second area AR2. Gaps GP between adjacent pairs of first portions PT1 are substantially equal to each other. As to FIG. 7, part (b), gaps GP between adjacent pairs of second portions PT2 are substantially equal to each other as in the case of FIG. 7, part (a).

FIG. 8 is a cross-sectional view of the first modified example of the first embodiment. The configuration shown in FIG. 8 is different from the configuration shown in FIG. 6 in the elastic modulus of the resin layer 9. In other words, the configuration shown in FIG. 8 shows the case where the elastic modulus of the support 8 in the resin layer 9 is adjusted. In FIG. 8, the elastic modulus of the coating layer 7 is uniform.

As shown in FIG. 8, parts (a) and (b), the elastic modulus of the support 8 decreases as the location is further from the center outwards. The resin layer 9 has a first elastic modulus E1 in the first area AR1 and a second elastic modulus E2 in the second area AR2. The first elastic modulus E1 is greater than the second elastic modulus E2. The support 8 has a fifth elastic modulus E5 in the first area AR1 and a sixth elastic modulus E6 in the second area AR2. The fifth elastic modulus E5 is greater than the sixth elastic modulus E6. The coating layer 7 has an equal elastic modulus in the first and second areas AR1 and AR2.

In the first modified example of the first embodiment with such a configuration discussed above, advantageous effects similar to those of the first embodiment can be obtained.

Figure 9:
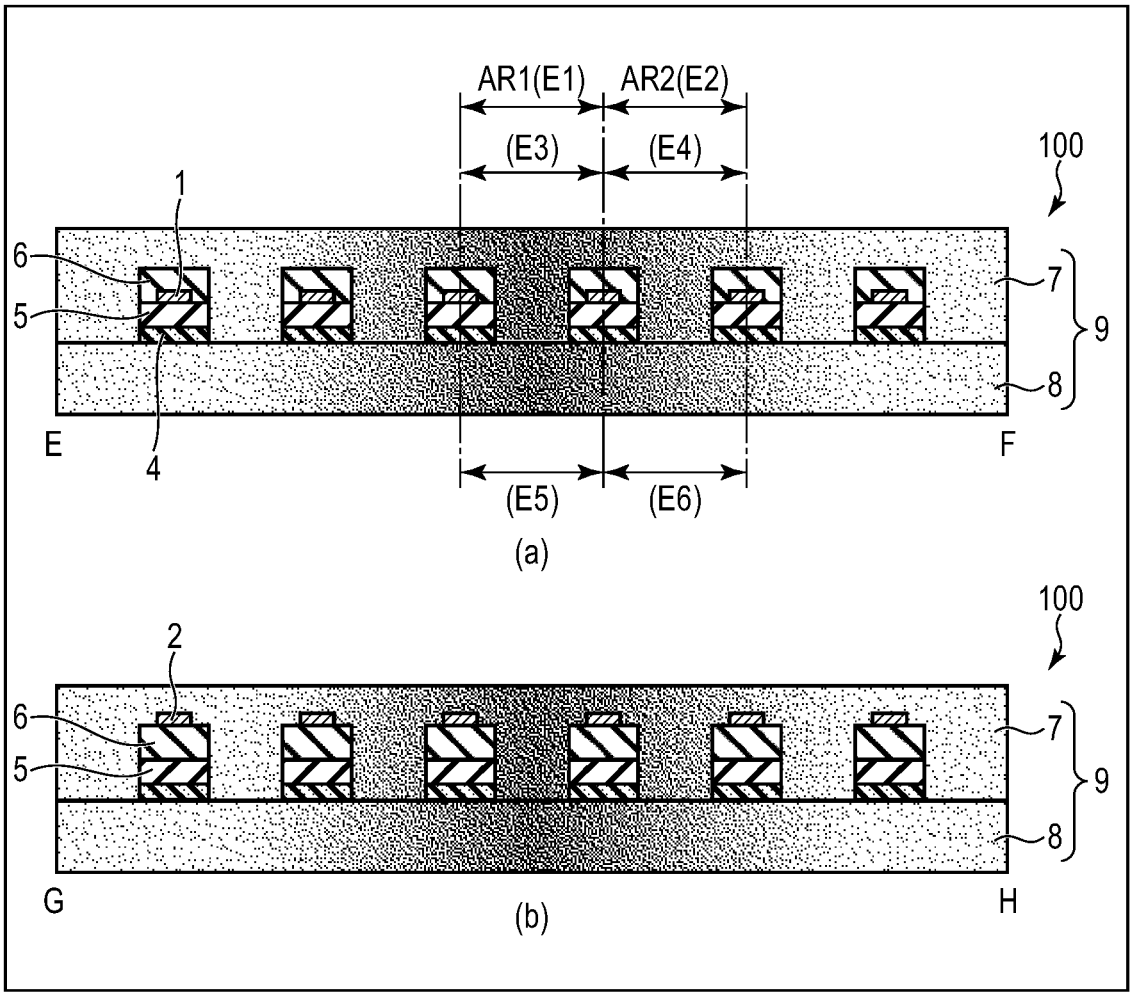
FIG. 9 is a cross-sectional view showing the second modified example of the first embodiment.

FIG. 9 is a cross-sectional view of the second modified example of the first embodiment. The configuration shown in FIG. 9 is different from the configuration shown in FIG.

6 in the elastic modulus of the resin layer 9. In other words, the configuration shown in FIG. 9 illustrates the case where the elastic moduli of both the coating layer 7 and the support 8 of the resin layer 9 are adjusted.

As shown in FIG. 9, parts (a) and (b), the elastic moduli of the coating layer 7 and the support 8 decrease as the location is further from the center outwards. The resin layer 9 has a first elastic modulus E1 in the first area AR1 and a second elastic modulus E2 in the second area AR2. The first elastic modulus E1 is greater than the second elastic modulus E2. The coating layer 7 has a third elastic modulus E3 in the first area AR1 and a fourth elastic modulus E4 in the second area AR2. The third elastic modulus E3 is greater than the fourth elastic modulus E4. The support 8 has a fifth elastic modulus E5 in the first area AR1 and a sixth elastic modulus E6 in the second area AR2. The fifth elastic modulus E5 is less than the sixth elastic modulus E6.

In the second modified example of the first embodiment, with such a configuration discussed above, advantageous effects similar to those of the first embodiment can be obtained.

FIG. 10 is a cross-sectional view showing a specific example of the first embodiment.

The flexible substrate 100 is affixed to a curved surface of an object 200. The flexible substrate 100 has a radius of curvature R1 in the first area AR1 and a radius of curvature R2 in the second area AR2. For example, the radius of curvature R1 is 10 mm and the radius of curvature R2 is 5 mm.

Here, the equations for the elastic modulus E and the geometrical moment of inertia I can be expressed as follows:

$$1/R = M/EI \quad (1),$$

$$I = bh^3/12 \quad (2)$$

where R represents the radius of curvature, M represents the bending moment, E is the elastic modulus, I represent the geometrical moment of inertia, b is the height of the resin layer and h is the width of the resin layer. First, let us examine the case where the elastic modulus of the first area AR1 is equal to that of the second area AR2. For example, it is supposed here that the elastic modulus of the first area AR1 and the modulus of the second area AR2 are both E=5 MPa. To calculate the geometrical moment of inertia $I_A$ for the first area AR1, the radius of curvature R1=10 and the elastic modulus E=5 are applied to the equation (1), which results in $1/10 = M/5I_A$, which is $I_A = 2M$. Further, to calculate the geometrical moment of inertia $I_B$ for the second area AR2, the radius of curvature R1=5 and the elastic modulus E=5 are applied to the equation (1), which results in $1/5 = M/5I_B$, which is $I_B = M$. Therefore, the geometrical moment of inertia $I_A$ of the first area AR1 is 2M ($I_A = 2M$) and the geometrical moment of inertia $I_B$ of the second area AR2 is M ($I_B = M$), and thus it can be understood that the first area AR1 deforms twice as much as the second area AR2.

Next, let us examine the case where the elastic modulus of the first area AR1 is different from that of the second area AR2. It is supposed here that the elastic modulus of the first area AR1 is: E=5 MPa and the modulus of the second area AR2 is: E=2.5 MPa. To calculate the geometrical moment of inertia $I_A$ for the first area AR1, the radius of curvature R1=10 and the elastic modulus E=5 are applied to equation (1), which results in $1/10 = M/5I_A$, which is $I_A = 2M$. To calculate the geometrical moment of inertia $I_B$ for the second area AR2, the radius of curvature R1=5 and the elastic modulus E=2.5 are applied to the equation (1), which results in $1/5 = M/2.5I_B$, which is $I_B = 2M$. Therefore, the geometrical moment of inertia $I_A$ of the first area AR1 is 2M ($I_A = 2M$) and the geometrical moment of inertia $I_B$ of the second area AR2 is 2M ($I_B = 2M$), it can be understood that the amounts of deformation in the first and second areas AR1 and AR2 are the same. Thus, as shown in the first embodiment above, the amount of deformation of the flexible substrate 100 can be made uniform by adjusting the elastic modulus of the resin layer 9 according to the curvature.

Figure 11:
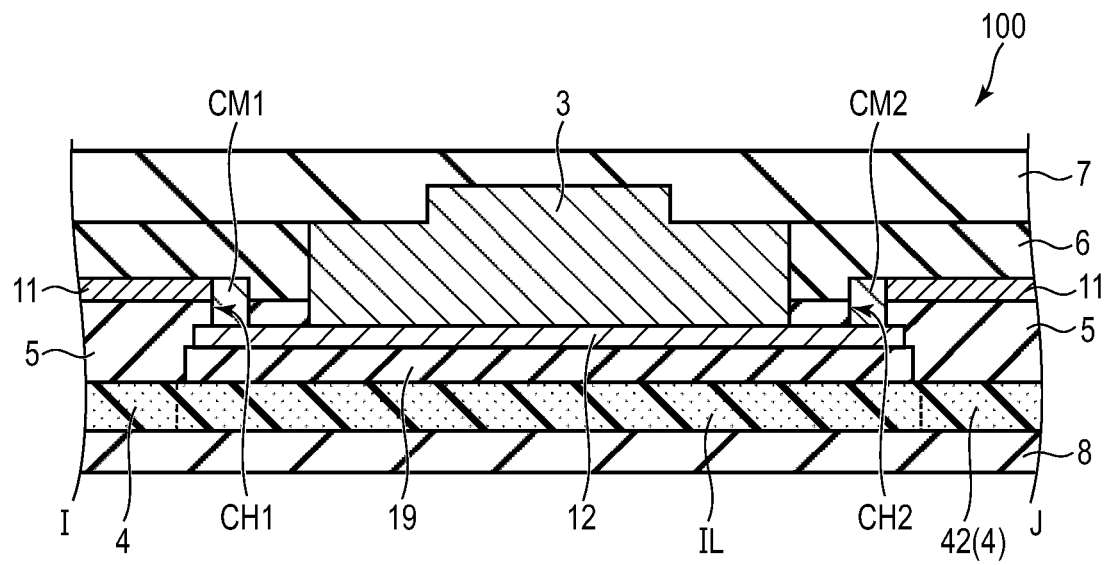
FIG. 11 a cross-sectional schematically showing a part of the flexible substrate, taken along line I-J in FIG. 2.

FIG. 11 is a schematic cross-sectional view of a part of the flexible substrate 100, indicated by line I-J in FIG. 2.

The electrical element 3 is placed on the island-shaped portion IL of the insulating base 4. Between the electrical element 3 and the island-shaped portion IL, an inorganic insulating layer 19 (passivation layer) is disposed. The inorganic insulating layer 19 is formed into an island shape superimposed on the electrical element 3 (or the island-shaped portion IL) in planar view. The first portion 11 is disposed on the first organic insulating layer 5 and is covered by the second organic insulating layer 6. The second portion 12 is disposed on the inorganic insulating layer 19 and is electrically connected to the electrical element 3. In the example shown in FIG. 11, both end portions of the second portion 12 are covered by the first organic insulating layer 5.

Contact holes CH1 and CH2 are provided in the first organic insulating layer 5. The first portion 11 is electrically connected to the second portion 12 via connection members CM1 and CM2 disposed in the contact holes CH1 and CH2, respectively. The connection members CM1 and CM2 may be part of the first portion 11 or may be provided separately from the first portion 11.

As described above, the island-shaped inorganic insulating layer 19 is disposed between the electrical element 3 and the insulating base 4. The inorganic insulating layer 19 functions as a protective film that inhibits the moisture and the like from entering the electrical elements 3 and the second portion 12 of the scanning line 1. With this structure, the reliability of the flexible substrate 100 can be improved. Moreover, inorganic films are generally more prone to cracking than organic films; however, the inorganic insulating layer 19 is not provided below the first portion 11 of the scanning line 1, disconnection in the first portion 11 can be suppressed. This is also the case for the signal lines, which are not shown in the figure. Further, as compared to the case where the inorganic insulating layer 19 is provided over the entire flexible substrate 100, the elasticity and flexibility of the flexible substrate 100 are less likely to be impaired.

Further, in the scanning line 1, the second portion 12 overlapping the electrical element 3 is located in a different layer from that of the first portion 11, and therefore the degree of freedom in design in the vicinity of the electrical element 3 is improved. Furthermore, the contact holes CH1 and CH2 are provided above the inorganic insulating layer 19, connection errors at the connection position between the first portion 11 and the second portion 12 can be suppressed.

The island-shaped portion IL of the insulating base 4 is disposed below the electrical element 3. With this configuration, the electrical element 3 can be well supported. Further, the insulating base 4 is supported by the support 8. With this structure, the overall strength of the flexible substrate 100 increases and further it is possible to prevent moisture and the like from entering from below.

Next, the second embodiment will be described. In the second embodiment, the thickness of the resin layer 9 before expanding the flexible substrate 100 is changed depending on the area to make the thickness of the resin layer 9 uniform when the flexible substrate 100 is expanded.

Figure 12:
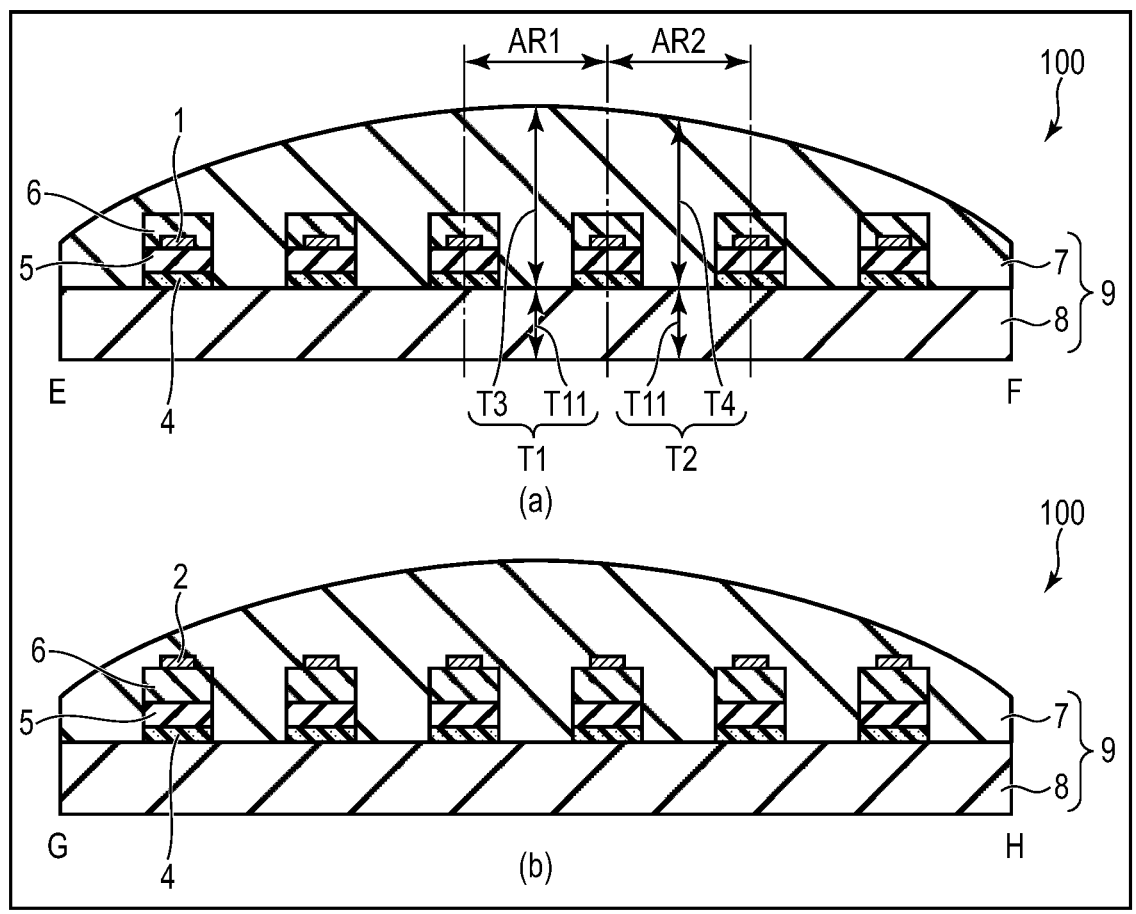
FIG. 12 is a cross-sectional view schematically showing a flexible substrate according to the second embodiment.

FIG. 12 is a schematic cross-sectional view of the flexible substrate 100 of the second embodiment. The configuration shown in FIG. 12 is different from that of FIG. 6 in the thickness of the resin layer 9. The configuration shown in FIG. 12 illustrates the case where the thickness of the coating layer 7 in the resin layer 9 is adjusted. In FIG. 12, the thickness of the support 8 is uniform. In the example illustrated in the figure, the flexible substrate 100 is not elongated and the first and second areas AR1 and AR2 are not curved.

As shown in FIG. 12, parts (a) and (b), the thickness of the resin layer 9 decreases as the location is further from the center outwards. In cross-sectional view, the resin layer 9 has a first film thickness T1 in the first area AR1 and a second film thickness T2 in the second area AR2. When the first and second areas AR1 and AR2 are not curved, the first film thickness T1 is greater than the second film thickness T2. The thickness of the coating layer 7 decreases as the location is further from the center outwards. The coating layer 7 has a third film thickness T3 in the first area AR1 and a fourth film thickness T4 in the second area AR2. When the first and second areas AR1 and AR2 are not curved, the third film thickness T3 is greater than the fourth film thickness T4. The support 8 has an equal film thickness T11 in the first and second areas AR1 and AR2. The film thickness T1 in the first area AR1 of the resin layer 9 is equivalent to a total of the film thickness T3 in the first area AR1 of the coating layer 7 and the film thickness T11 in the first area AR1 of the support 8. Similarly, the thickness T2 of the second area AR2 of the resin layer 9 is equivalent to a total of the thickness T4 in the second area AR2 of the coating layer 7 and the thickness T11 in the second area AR2 of the support 8. In the example illustrated in the figure, the thickness of the coating layer 7 is changed gradually, but it may be changed stepwise.

FIG. 13 is a cross-sectional view of the flexible substrate 100 shown in FIG. 12 in a curved state.

The flexible substrate 100 shown in FIG. 13, parts (a) and (b), has a curvature that increases as the location is further from the center outwards. In other words, the first area AR1 and the second area AR2 are curved, and the curvature of the first area AR1 is less than that of the second area AR2. At this time, the first film thickness T1 is equal to the second film thickness T2. That is, in the state where the flexible substrate 100 has a curvature, the resin layer 9 has a uniform thickness. As the curvature of the area is larger, the resin layer 9 is formed to have a less film thickness in the state before the flexible substrate 100 is elongated, as shown in FIG. 12. Further, gaps GP between adjacent pairs of first portions PT1 are substantially equal to each other. As to FIG. 7, part (b), gaps GP between adjacent pairs of second portions PT2 are substantially equal to each other as in the case of FIG. 7, part (a).

According to the second embodiment, before the flexible substrate 100 is elongated, the resin layer 9 has different thicknesses in different areas. For example, if the film thickness of the resin layer 9 before the flexible substrate 100 is elongated is uniform, the film thickness of the resin layer 9 may differ from one area to another after the flexible substrate 100 is elongated. In the second embodiment, the film thickness of the resin layer 9 is adjusted in advance according to the curvature of the surface of the object on which the layer is attached, the film thickness of the resin layer 9 after the flexible substrate 100 is elongated can be made uniform. Therefore, unevenness in optical characteristics and light-receiving amount, which may occur depending on the area, can be suppressed.

Figure 14:
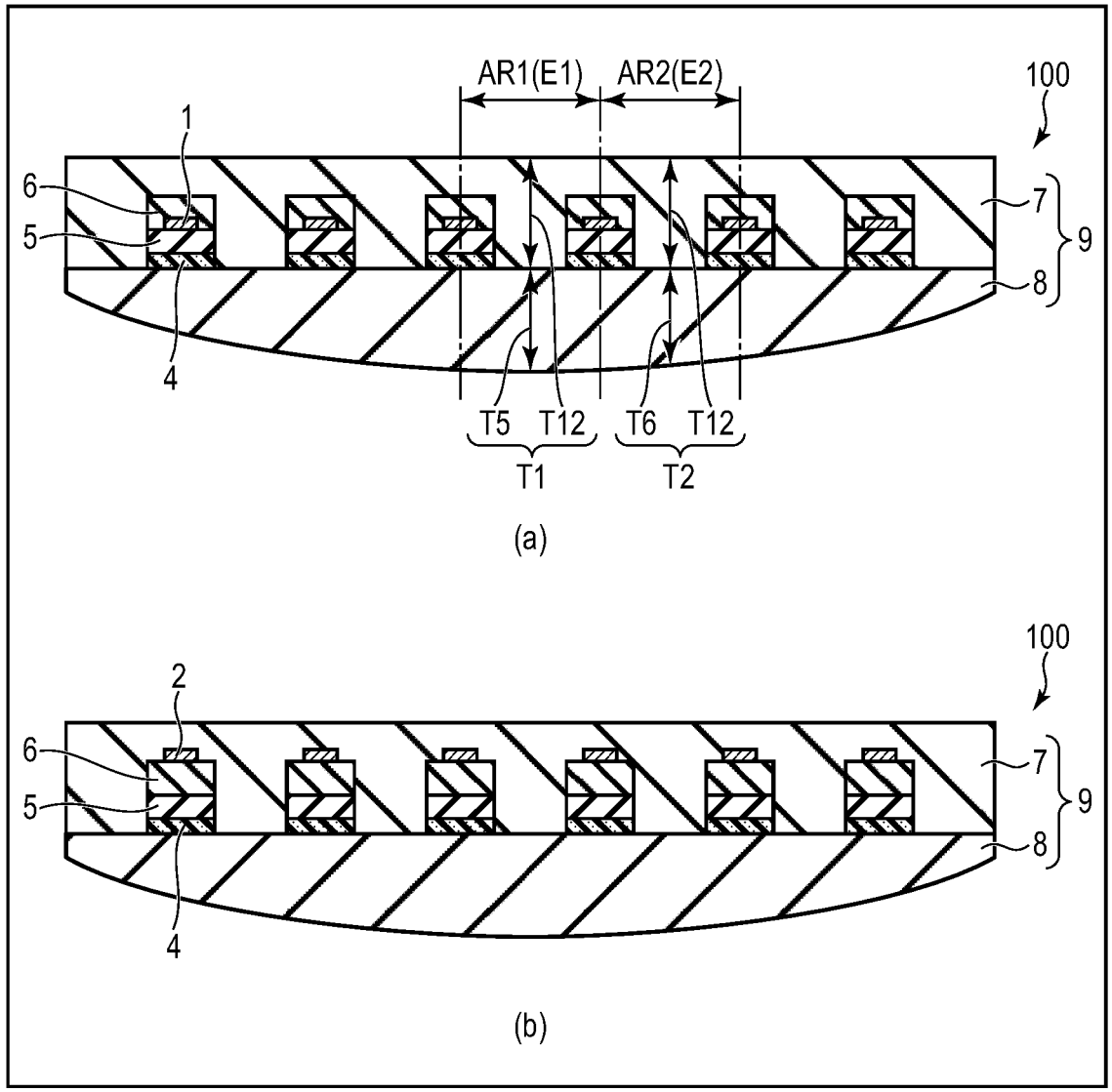
FIG. 14 is a cross-sectional view showing the first modified example of the second embodiment.

FIG. 14 is a cross-sectional view of the first modified example of the second embodiment. The configuration shown in FIG. 14 is different from that of FIG. 6 in the film thickness of the resin layer 9. The configuration shown in FIG. 14 illustrates the case where the film thickness of the support 8 in the resin layer 9 is adjusted. In FIG. 14, the thickness of the coating layer 7 is uniform. Further, in the example illustrated in the figure, the flexible substrate 100 is not elongated, and the first and second areas AR1 and AR2 are not curved.

As shown in FIG. 14, parts (a) and (b), the thickness of the resin layer 9 decreases as the location is further from the center outwards. The resin layer 9 has a first film thickness T1 in the first area AR1 and a second film thickness T2 in the second area AR2. When the first and second areas AR1 and AR2 are not curved, the first film thickness T1 is greater than the second film thickness T2. The film thickness of the support 8 decreases as the location is further from the center outwards. The support 8 has a fifth film thickness T5 in the first area AR1 and a sixth film thickness T6 in the second area AR2. When the first and second areas AR1 and AR2 are not curved, the fifth film thickness T5 is greater than the sixth film thickness T6. The coating layer 7 has an equal film thickness T12 in the first and second areas AR1 and AR2. The thickness T1 of the first area AR1 of the resin layer 9 is equivalent to a total of the thickness T12 in the first area AR1 of the coating layer 7 and the thickness T5 in the first area AR1 of the support 8. Similarly, the thickness T2 in the second area AR2 of the resin layer 9 is equivalent to a total of the thickness T12 in the second area AR2 of the coating layer 7 and the thickness T6 in the second area AR2 of the support 8. In the example illustrated in the figure, the thickness of the support 8 is changed gradually, but it may be changed stepwise.

In the first modified example of the second embodiment as well, advantageous effects similar to those of the second embodiment described above can be obtained.

Figure 15:
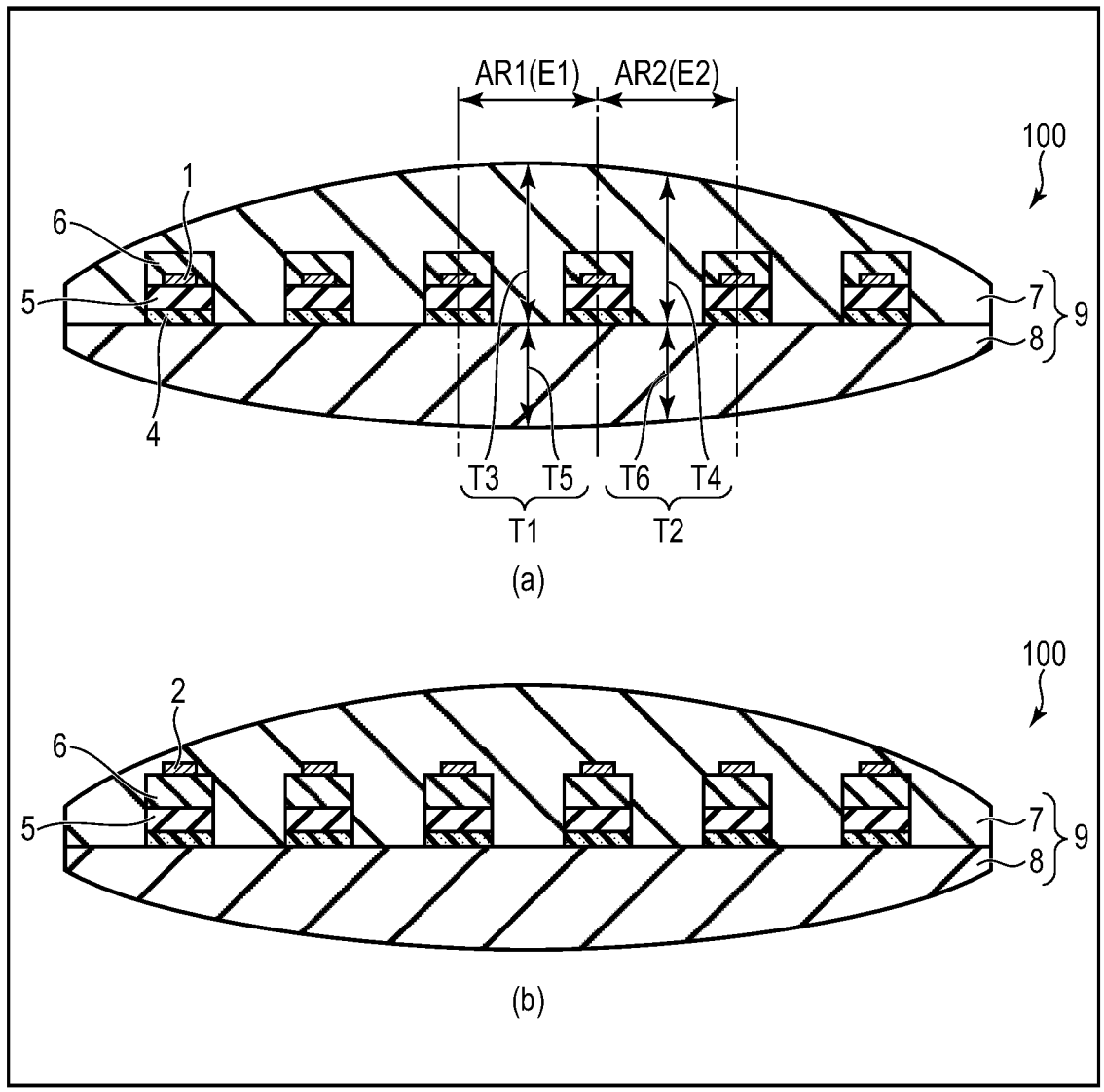
FIG. 15 is a cross-sectional view showing the second modified example of the second embodiment.

FIG. 15 is a cross-sectional view of the second modified example of the second embodiment. The configuration shown in FIG. 15 is different from that of FIG. 6 in the film thickness of the resin layer 9. The configuration shown in FIG. 15 illustrates the case where the film thicknesses of both the coating layer 7 and the support 8 of the resin layer 9 are adjusted. In the example illustrated in the figure, the flexible substrate 100 is not elongated, and the first and second areas AR1 and AR2 are not curved.

As shown in FIG. 15, parts (a) and (b), the thickness of the resin layer 9 decreases as the location is further from the center outwards. The resin layer 9 has a first film thickness T1 in the first area AR1 and a second film thickness T2 in the second area AR2. When the first and second areas AR1 and AR2 are not curved, the first film thickness T1 is greater than the second film thickness T2. The film thickness of the coating layer 7 decreases as the location is further from the center outwards. The coating layer 7 has a third film thickness T3 in the first area AR1 and a fourth film thickness T4 in the second area AR2. When the first and second areas AR1 and AR2 are not curved, the third film thickness T3 is greater than the fourth film thickness T4. The film thickness of the support 8 decreases as the location is further from the center outwards. The support 8 has a fifth film thickness T5 in the first area AR1 and a sixth film thickness T6 in the second area AR2. When the first and second areas AR1 and AR2 are not curved, the fifth film thickness T5 is greater than the sixth film thickness T6. The film thickness T1 in the first area AR1 of the resin layer 9 is equivalent to a total of the film thickness T3 in the first area AR1 of the coating layer 7 and the film thickness 15 in the first area AR1 of the support 8. Similarly, the film thickness T2 in the second area AR2 of the resin layer 9 is equivalent to a total of the film thickness T4 in the second area AR2 of the coating layer 7 and the film thickness T6 in the second area AR2 of the support 8. In the illustrated example, the thicknesses of the coating layer 7 and the support 8 are changed gradually, but they may be changed stepwise.

In the second modified example of the second embodiment with such a configuration as well, advantageous effects similar to those of the second embodiment described above can be obtained.

Figure 16:
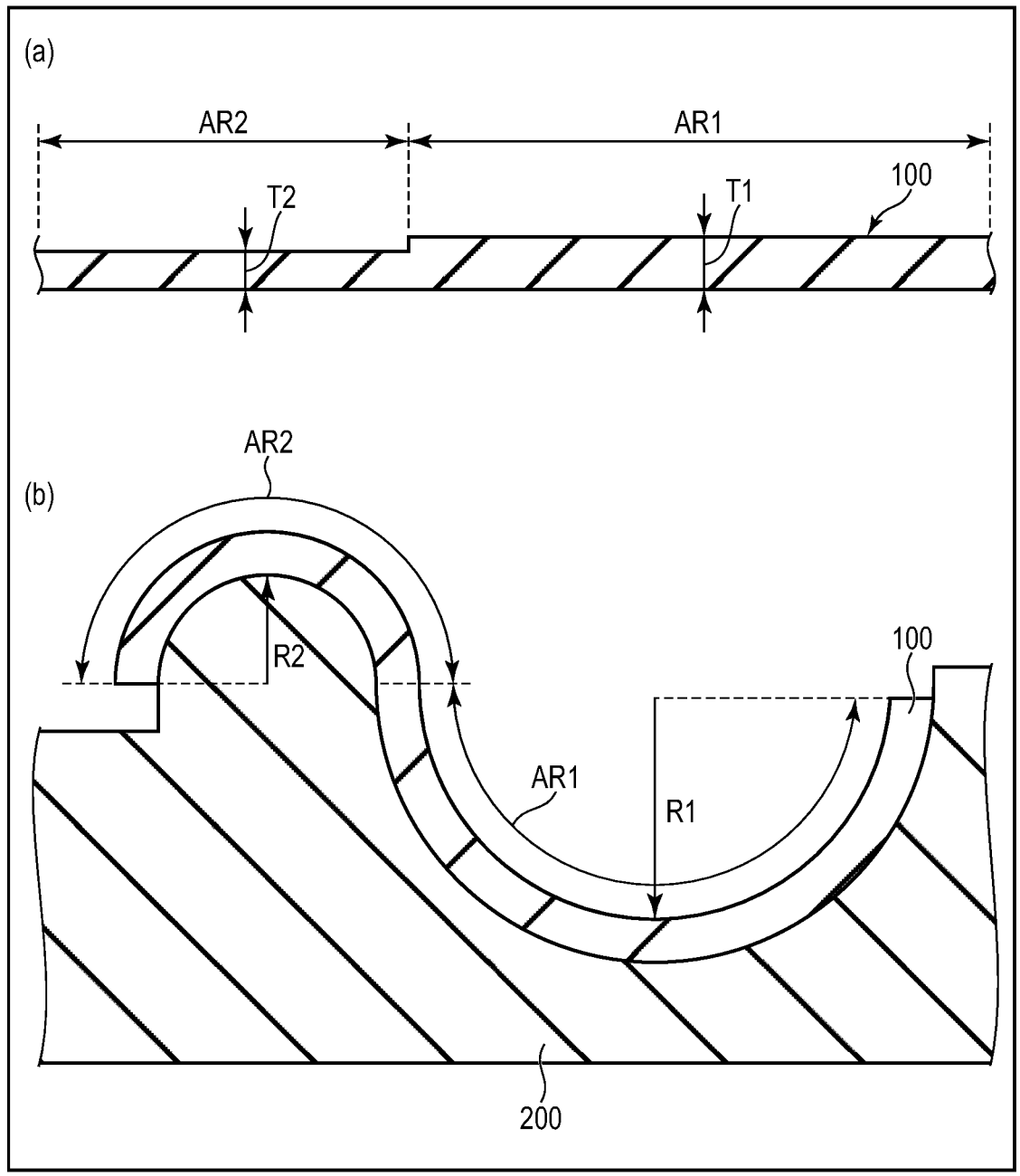
FIG. 16 is a cross-sectional view showing a specific example of the second embodiment.

FIG. 16 is a cross-sectional view of a specific example of the second embodiment.

As shown in FIG. 16, part (a), the flexible substrate 100 has a film thickness T1 in the first area AR1 and a film thickness T2 in the second area AR2. The film thickness T1 is greater than the film thickness T2. As shown in FIG. 16, part (b), the flexible substrate 100 is affixed to a curved surface of the object 200. The flexible substrate 100 has a radius of curvature R1 in the first area AR1 and a radius of curvature R2 in the second area AR2. Here, the radius of curvature R1 is 10 mm and the radius of curvature R2 is 5 mm.

Here, the equations for the elastic modulus E and the geometrical moment of inertia I are expressed as follows:

$$1/R = M/EI \quad (1),$$

$$I = bh^3/12 \quad (2)$$

where R represents the radius of curvature, M represents the bending moment, E represents the elastic modulus, I represents the geometrical moment of inertia, b represents the height of the resin layer, and h represents the width of the resin layer. First, let us examine the case where it is assumed that the thickness of the film in the first area AR1 is equal to the thickness of the film in the second area AR2. In this case, it is also assumed that the elastic moduli of the first area AR1 and the second area AR2 are both 5 MPa (E=5 MPa). To calculate the geometrical moment of inertia $I_A$ the first area AR1, the radius of curvature R1=10 and the elastic modulus E=5 are applied to equation (1), which results in $1/10 = M/5I_A$, which is $I_A = 2M$. On the other hand, to calculate the geometrical moment of inertia $I_B$ for the second area AR2, the radius of curvature R1=5 and the elastic modulus E=5 are applied to the equation (1), which results in $1/5 = M/5I_B$, which is $I_B = M$. Thus, the geometrical moment of inertia of the first area AR1 is 2M ($I_A = 2M$) and the geometrical moment of inertia of the second area AR2 is M ($I_B = M$), and therefore it can be understood that the first area AR1 deforms twice as much as the second area AR2.

Next, let us examine the case where the film thickness T1 in the first area AR1 is different from the film thickness T2 in the second area AR2. The film thickness T1 in the first area AR1 is equivalent to the height b of the resin layer. Further, it is assumed, for example, the film thickness T2 in the second area AR2 is half of the film thickness T1 and equivalent to the height b/2 of the resin layer. Here, it is also assumed that the elastic moduli of the first area AR1 and the second area AR2 are both 5 MPa (E=5 MPa). To calculate the geometrical moment of inertia I for the first area AR1, the radius of curvature R1=10 and the elastic modulus E=5 are applied to the equation (1), which results in $1/10 = M/5I_A$, which is $I_A = 2M$. To calculate the geometrical moment of inertia $I_B$ for the second area AR2, the radius of curvature R2=5 and the elastic modulus E=5 are applied to the equation (1), which results in 1/5=M/5I, which is I=M. Here, since the height of the resin layer is b/2, $(bh^3/12)/2 = M$ can be obtained from the equation (2). Therefore, $I_B = 2M$ is obtained. Thus, since the geometrical moment of inertia of the first area AR1 is 2M ($I_A = 2M$) and the geometrical moment of inertia of the second area AR2 is 2M ($I_B = 2M$), it can be understood that the deformation amounts of the first and second areas AR1 and AR2 are the same. Therefore, as shown in the second embodiment provided above, the amount of deformation of the flexible substrate 100 can be made uniform by adjusting the film thickness of the resin layer 9 according to the curvature.

As explained above, according to the embodiments, flexible substrates in which the expansion rate and film thickness can be adjusted according to the curvature can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
   an insulating base comprising a first surface and a second surface on an opposite side to the first surface;
   a wiring layer provided on the second surface side of the insulating base; and
   a resin layer including a support located on the first surface side of the insulating base and a coating layer located on the second surface side of the insulating base, wherein
   the insulating base includes, in planar view, a plurality of wavy first portions extending along a first direction and arranged along a second direction intersecting the first direction, a plurality of wavy second portions extending along the second direction and arranged along the first direction, island-like portions at respective intersections between the wavy first portions and the wavy second portions, and a plurality of areas surrounded by the wavy first portions and the wavy second portions,
   the resin layer includes a first area and a second area in planar view,
   the resin layer has a first elastic modulus in the first area and a second elastic modulus in the second area, and
   the first elastic modulus is greater than the second elastic modulus, and
   sizes of the areas surrounded by the wavy first portions and the wavy second portions are made even when the flexible substrate is affixed to a surface with non-uniform curvature.

2. The flexible substrate of claim 1, wherein
   a curvature in the first area is less than a curvature in the second area.

3. The flexible substrate of claim 1, wherein
   the coating layer has a third elastic modulus in the first area and a fourth elastic modulus, which is less than the third elastic modulus, in the second area, and
   the support has an equal elastic modulus in the first area and the second area.

4. The flexible substrate of claim 1, wherein
the support has a fifth elastic modulus in the first area and a sixth elastic modulus, which is less than the fifth elastic modulus, in the second area, and
the coating layer has an equal elastic modulus in the first area and the second area.

5. The flexible substrate of claim 1, wherein
the coating layer has a third elastic modulus in the first area and a fourth elastic modulus, which is less than the third elastic modulus, in the second area, and
the support has a fifth elastic modulus in the first area and a sixth elastic modulus, which is less than the fifth elastic modulus, in the second area.

6. A flexible substrate comprising:
an insulating base comprising a first surface and a second surface on an opposite side to the first surface;
a wiring layer provided on the second surface side of the insulating base; and
a resin layer including a support located on the first surface side of the insulating base and a coating layer located on the second surface side of the insulating base, wherein
the insulating base includes, in planar view, a plurality of wavy first portions extending along a first direction and arranged along a second direction intersecting the first direction, a plurality of wavy second portions extending along the second direction and arranged along the first direction, island-like portions at respective intersections between the wavy first portions and the wavy second portions, and a plurality of areas surrounded by the wavy first portions and the wavy second portions,
the resin layer includes a first area and a second area in planar view,
the resin layer has a first film thickness in the first area and a second film thickness in the second area in a cross-sectional view,
the first film thickness is greater than the second film thickness when the first area and the second area have no curvature,
the first film thickness is equal to the second film thickness when the first area and the second area have curvature, and
sizes of the areas surrounded by the wavy portions first and the wavy second portions are made even when the flexible substrate is affixed to a surface with non-uniform curvature.

7. The flexible substrate of claim 6, wherein
the coating layer has a third film thickness in the first area and a fourth film thickness in the second area,
the third film thickness is greater than the fourth film thickness when the first area and the second area have no curvature, and
the support has an equal film thickness in the first area and the second area.

8. A flexible substrate comprising:
an insulating base comprising a first surface and a second surface on an opposite side to the first surface;
a wiring provided on the second surface side of the insulating base; and
a resin layer including a support located on the first surface side of the insulating base and a coating layer located on the second surface side of the insulating base, wherein
the resin layer includes a first area and a second are in planar view,
the resin layer has a first film thickness in the first area and a second film thickness in the second area in a cross-sectional view,
the first film thickness is greater than the second film thickness when the first area and the second area have no curvature,
the first film thickness is equal to the second film thickness when the first area and the second area have curvature, and
a curvature of the first area is less than a curvature of the second area when the first area and the second area have curvature.

9. A flexible substrate comprising:
an insulating base comprising a first surface and a second surface on an opposite side to the first surface;
a wiring layer provided on the second surface side of the insulating base; and
a resin layer including a support located on the first surface side of the insulating base and a coating layer located on the second surface side of the insulating base, wherein
the resin layer includes a first area and a second area in planar view,
the resin layer has a first film thickness in the first area and a second film thickness in the second area in a cross-sectional view,
the first film thickness is greater than the second film thickness when the first area and the second area have no curvature,
the first film thickness is equal to the second film thickness when the first area and the second area have curvature,
the support includes a fifth film thickness in the first area and a sixth film thickness in the second area,
the fifth film thickness is greater than the sixth film thickness when the first area and the second area have no curvature, and
the coating layer has equal film thickness in the first area and the second area.

10. A flexible substrate comprising:
an insulating base comprising a first surface and a second surface on an opposite side to the first surface;
a wiring layer provided on the second surface side of the insulating base; and
a resin layer including a support located on the first surface side of the insulating base and a coating layer located on the second surface side of the insulating base, wherein
the resin layer includes a first area and a second area in planar view,
the resin layer has a first film thickness in the first area and a second film thickness in the second area in a cross-sectional view,
the first film thickness is greater than the second film thickness when the first area and the second area have no curvature,
the first film thickness is equal to the second film thickness when the first area and the second area have curvature,
the coating layer has a third film thickness in the first area and a fourth film thickness in the second area,
the third film thickness is greater than the fourth film thickness when the first area and the second area have no curvature,
the support has a fifth film thickness in the first area and a sixth film thickness in the second area, and the fifth film thickness is greater than the sixth film thickness when the first area and the second area have no curvature.

* * * * *